United States Patent
Park

(10) Patent No.: US 7,863,917 B2
(45) Date of Patent: Jan. 4, 2011

(54) SEMICONDUCTOR CHIP HAVING A CRACK TEST CIRCUIT AND METHOD OF TESTING A CRACK OF A SEMICONDUCTOR CHIP USING THE SAME

(75) Inventor: Joo-Sung Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 289 days.

(21) Appl. No.: 11/797,426

(22) Filed: May 3, 2007

(65) Prior Publication Data
US 2007/0257353 A1 Nov. 8, 2007

(30) Foreign Application Priority Data
May 4, 2006 (KR) .................. 10-2006-0040382

(51) Int. Cl.
*G01R 31/02* (2006.01)
(52) U.S. Cl. ..................................... 324/763
(58) Field of Classification Search ............. 324/158.1, 324/754–765; 257/48; 438/14, 17–18, 612–614, 438/617
See application file for complete search history.

(56) References Cited

U.S. PATENT DOCUMENTS

| | | | | |
|---|---|---|---|---|
| 6,094,144 A * | 7/2000 | Dishongh et al. | ........... | 340/653 |
| 6,181,154 B1 * | 1/2001 | Beffa | ........... | 324/765 |
| 6,384,610 B1 * | 5/2002 | Wilson | ........... | 324/663 |
| 6,577,149 B2 * | 6/2003 | Doong et al. | ........... | 324/765 |
| 6,650,010 B2 * | 11/2003 | Davis et al. | ........... | 257/700 |
| 6,683,465 B2 * | 1/2004 | Fetterman et al. | ........... | 324/719 |
| 7,250,311 B2 * | 7/2007 | Aoki et al. | ........... | 438/14 |
| 7,700,944 B2 * | 4/2010 | Nishizawa | ........... | 257/48 |
| 2008/0012572 A1 * | 1/2008 | Tsukuda | ........... | 324/522 |
| 2009/0174426 A1 * | 7/2009 | Matoba et al. | ........... | 324/763 |

FOREIGN PATENT DOCUMENTS

| | | |
|---|---|---|
| JP | 06-244254 | 9/1994 |
| JP | 2005-277338 | 10/2005 |
| JP | 2005-353815 | 12/2005 |
| KR | 10-2005-0055805 | 6/2005 |

OTHER PUBLICATIONS

Korean Office Action issued Feb. 26, 2007 for Korean Patent Publication No. 10-2006-0040382.

* cited by examiner

*Primary Examiner*—Ha Tran T Nguyen
*Assistant Examiner*—Joshua Benitez
(74) *Attorney, Agent, or Firm*—Harness, Dickey & Pierce, P.L.C.

(57) ABSTRACT

A semiconductor chip includes a line structure arranged along a peripheral region of the semiconductor chip region in order to inspect a crack, a first pad and second pad arranged on different end portions of the line structure, a second pad arranged on another end portion of the line structure, an inspection device activated during a crack test mode to electrically connect the first pad, the line structure and the second pad. The inspection device may include a first switching circuit connected between the first pad and the line structure, the first switching circuit being deactivated during a normal operation mode and being activated a crack test mode; and a second switching circuit connected between the second pad and the line structure, the second switching circuit being deactivated during the normal operation mode and being activated during the crack test mode.

17 Claims, 4 Drawing Sheets

SEMICONDUCTOR CHIP HAVING A CRACK TEST CIRCUIT AND METHOD OF TESTING A CRACK OF A SEMICONDUCTOR CHIP USING THE SAME

PRIORITY STATEMENT

This application claims priority under 35 USC §119 to Korean Patent Application No. 2006-40382 filed on May 4, 2006, the entire contents of which are herein incorporated by reference.

BACKGROUND

1. Field

Example embodiments relate to a semiconductor chip having a crack test circuit and a method of testing a crack of a semiconductor chip using the same. More particularly, example embodiments relate to a semiconductor chip capable of electrically inspecting a crack and a method of testing a crack of a semiconductor chip having the crack test circuit.

2. Description of the Related Art

Generally, unit processes such as a process forming a layer, an etching process, a diffusion process, a process for forming a metal wire, etc., are repeatedly performed on a silicon wafer to form a semiconductor chip.

In particular, various unit processes may be performed on a silicon wafer to form a plurality of the semiconductor chips on the silicon wafer. The semiconductor chips are generally spaced apart from each other by a desired and/or predetermined distance. A region on which the semiconductor chips are formed is referred to as a semiconductor chip region, and a region arranged between adjacent semiconductor chips is referred to as a scribe lane.

Unit cells of the semiconductor chips and a peripheral circuit for driving the unit cells are typically formed on the semiconductor chip region. In addition, pads are typically arranged on a peripheral region of a semiconductor region and are used to apply an external electric signal to the semiconductor chips.

After the semiconductor chips are formed on the silicon wafer through one or more of the unit processes, each of the semiconductor chips is packed. In order to pack the semiconductor chips a sawing process may be performed on the silicon wafer to cut along a middle line of the scribe lane to divide the silicon wafer into separate semiconductor chips. For example, the sawing process may be performed by operating a thin disk-shaped sawing blade to cut along the middle line of the scribe lane at a rapid speed.

When the silicon wafer is physically divided, as mentioned above, micro-protrusions may be formed on the various sections of the physically divided silicon wafer. It is generally difficult to obtain a surface having a uniform thickness on the section. Accordingly, a crack may be generated along a section of the scribe lane due to the sawing process. The crack may also be generated on the semiconductor chip region. In general, a defect that the crack generated on the semiconductor region by the sawing process is referred to as a chipping.

The generated crack may enable moisture to penetrate therein, which may cause a malfunction and decrease reliability of the semiconductor device on the semiconductor chip.

In a conventional method of inspecting a crack, data of the crack may be obtained from an image of a section photographed by an optical instrument such as an optical microscope, for example. This data may then be processed and analyzed. However, inspecting a crack according to the above-described conventional method may take a significant amount of time. Further, it may be difficult to inspect minute cracks using the above-described conventional method.

In another conventional method of inspecting a crack, the crack is electrically inspected. The extra pads are connected to different end portions of the inspection line. An electrical signal may be applied to the extra pads and an outputted current, or a resistance, may be detected to inspect the crack. The inspection line surrounds the peripheral region of the semiconductor chip region. Therefore, if a crack is generated, a portion of the inspection line may be damaged or broken, which may result in an increased resistance of the inspection line. Accordingly, the current or the resistance between the extra pads may be detected to assure the detected value is in an allowable range.

However, in order to implement the above-described method, at least two extra pads, which may be connected to different end portions of the inspection line, are required. Therefore, this conventional method decreases the integration degree of the semiconductor chips because extra pads are required.

SUMMARY

Example embodiments provide a semiconductor chip capable of electrically inspecting a crack and a method of inspecting a semiconductor chip.

As indicated above, an example embodiment provides a semiconductor chip. The semiconductor chip may include a line structure arranged along a peripheral region of the semiconductor chip region in order to inspect a crack, a first pad arranged on one end portion of the line structure, a second pad arranged on another end portion of the line structure, and an inspection device activated during a crack test mode to electrically connect the first pad, the line structure and the second pad. The inspection device may include a first switching circuit connected between the first pad and the line structure, the first switching circuit being deactivated during a normal operation mode and activated during a crack test mode in response to a mode set signal; and a second switching circuit connected between the second pad and the line structure, the second switching circuit being deactivated during the normal operation mode and activated during the crack test mode in response to the mode set signal.

In an example embodiment of the present invention, the first and the second switching circuits may include one or more transistors and/or diodes controlled by the mode set signal.

Further, the first and the second pads may receive a test signal during the crack test mode and a signal for driving the semiconductor chip during a normal operation mode.

Another example embodiment also provides a semiconductor chip. The semiconductor chip may include a line structure arranged along a peripheral region of the semiconductor chip region in order to inspect a crack, a first pad arranged on one end portion of the line structure, a second pad arranged on another end portion of the line structure, one or more capacitors connected between the line structure and a ground to delay a signal passing through the line structure, and an inspection device. The inspection device according to this example embodiment may include a combining circuit and a driving circuit. The combining circuit may be connected between the first pad and the line structure, the combining circuit blocking a signal applied to the first pad during a normal operation mode and passing a signal applied to the first pad during a crack test mode in response to a combination of the test signal and a mode set signal. The driving circuit may be connected between the second pad and the line structure, the driving circuit applying a test signal passed through the line structure to the second pad or a response signal corresponding to the delayed test signal.

In an example embodiment, the combining circuit may include a first signal modulator receiving and modulating the mode set signal and a second signal modulator having a first input portion for receiving the signal inputted to the first pad and a second input portion for receiving a signal outputted from the first signal modulator. The second signal modulator may output a signal having a signal level based on the signals inputted through the first and the second input portions. The second signal modulator may include a NAND logic circuit or an AND logic circuit.

In an example embodiment, the driving circuit may include an inverter outputting a logic signal different from the signal applied to the first pad.

Still another example embodiment provides a method of inspecting a crack of a semiconductor chip. The method may include setting the semiconductor chip into a crack test mode in response to at least one received signal; activating an inspection device of the semiconductor chip to electrically connect a first pad, line structure, and second pad of the semiconductor chip; applying a test signal to at least one of the first and second pads that propagates through the line structure to the other of the first and second pads; measuring a characteristic relating to the applied test signal and providing an indication of the presence or severity of the crack; and outputting the measured characteristic. The measured characteristic is the current flowing between the first pad and the second pad during a crack test mode according to one example embodiment of a method of inspecting a crack of a semiconductor chip.

During the activation of the inspection device, a first switching circuit connected between one end portion of a line structure arranged along a peripheral region of the semiconductor chip region and a first pad, and a second switching circuit connected between another end portion of the line structure and a second pad are activated in response to setting the test mode. A test signal may be applied to the both end portions of the first and the second pads. After a current between the first pad and the second pad is measured, a crack may be detected and/or indicated when the measured current is lower than a threshold value.

The applied test signal may have a voltage level different from a voltage level of a driving signal applied to the first and second pads during a normal operation mode of the semiconductor chip.

Still another example embodiment provides a method of inspecting a crack of a semiconductor chip. The method may include setting the semiconductor chip in crack test mode. Then, a test signal may be selectively applied to an end portion of a line structure, in response to a combination of the crack test mode signal and the test signal applied through a first pad. The test signal is delayed by one or more capacitors connected between a line structure and ground. After the test signal is delayed through the one or more capacitors connected to the line structure, the delayed test signal is selectively applied to a second pad. A time delay between a time when the test signal is applied to the first pad and a time when the delayed test signal reaches the second pad is measured. A crack is detected when the measured time delay is out of a permissible range according to this example embodiment.

BRIEF DESCRIPTION OF THE DRAWINGS

The above and other features, aspects and advantages of example embodiments will become more apparent from a review of the detailed description that refers to the accompanying drawings, in which.

DETAILED DESCRIPTION OF EXAMPLE EMBODIMENTS

Figure 1:
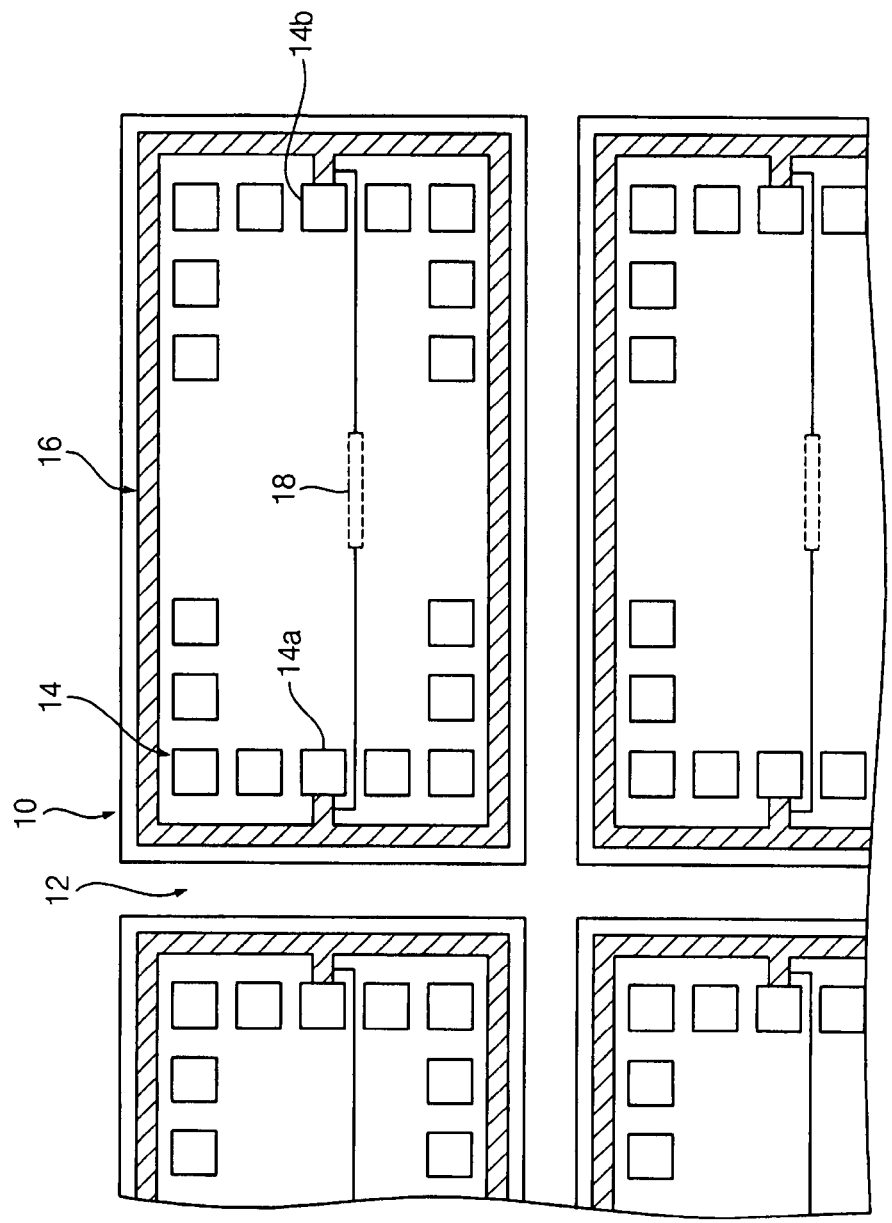
FIG. 1 is a plan view illustrating a semiconductor chip according to a first example embodiment.

Various example embodiments are described more fully hereinafter with reference to the accompanying drawings, in which example embodiments are shown. This invention may, however, be embodied in many different forms and should not be construed as limited to the example embodiments set forth herein. Rather, these example embodiments are provided so that this disclosure will be thorough and complete, and will fully convey the scope of the disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will also be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, region, layer or section. Thus, a first element, component, region, layer or section discussed below could be termed a second element, component, region, layer or section without departing from the teachings of this disclosure.

Spatially relative terms, such as "beneath," "below," "lower," "above," "upper" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the drawings are schematic in nature and their shapes are not intended to illustrate the actual shape of a region of a device and are not intended to limit the scope of this disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an example embodiment is explained with reference to the accompanying drawings.

Figure 2:
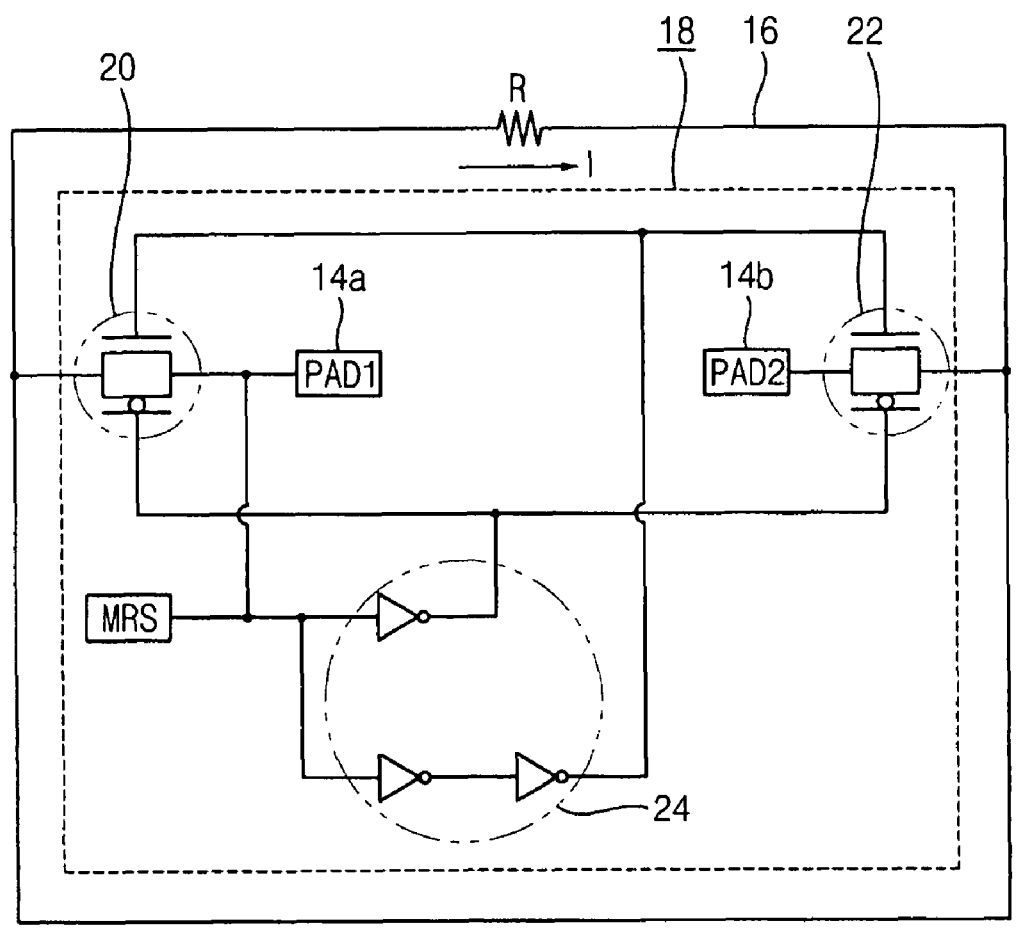
FIG. 2 is an example block diagram illustrating the semiconductor chip shown in FIG. 1.

FIG. 1 is a plan view illustrating a semiconductor chip according to a first example embodiment. FIG. 2 is an example block diagram illustrating the semiconductor chip shown in FIG. 1.

Referring to FIG. 1, a silicon wafer divided into semiconductor chip regions 10 and scribe lane regions 12 is provided.

As shown in FIG. 1, unit cells and peripheral circuits for driving the unit cells are formed on the semiconductor chip region 10. In addition, pads 14 for applying an external electric signal to the circuits are formed on a peripheral region of the semiconductor chip region 10. Each of the pads 14 may be classified as an address pad for assigning addresses of the unit cells, a data pad for inputting and outputting data to and from the unit cells, or a command pad for setting the unit cells into a functional state, for example.

Still referring to FIG. 1, a line structure 16 is formed in the peripheral region of the semiconductor chip region 10. The line structure 16 may be used to detect a crack and/or to protect the chip. The line structure 16 may have a linear shape surrounding most of the peripheral region of the semiconductor chip region 10. As shown in FIG. 1, the line structure 16 may have a rectangular annular shape that surrounds the entire peripheral region of the semiconductor chip region 10.

According to another example embodiment, the line structure 16 may have a multi-layered structure whose contacts and lines are stacked. The vertically stacked layers may have a linear shape for surrounding most of the peripheral region of the semiconductor chip region 10. The contacts may be spaced apart from each other by a uniform distance to connect each of the vertically stacked layers to each other.

According to still another example embodiment, the line structure 16 may have a dual annular shape in which at least two conductive lines are arranged in parallel with each other.

Two of the pads 14 may be for applying the electric signal to the semiconductor chip and may be arranged on different end portions of the line structure 16 according to an example embodiment. For example, a first pad 14a is arranged on one end portion of the line structure 16 and a second pad 14b is arranged on another end portion of the line structure 16. According to an example embodiment, the first and the second pads 14a and 14b are used for applying an electric signal to drive the cells during a normal operation mode and to inspect a crack of the semiconductor chip during a crack test mode.

According to an example embodiment, switching circuits 18 for electrically shorting and opening the first pad 14a, the second pad 14b, and the line structure 16 are provided. Hereinafter, the switching circuits 18 are explained with reference to FIG. 2.

According to an example embodiment, a first switching circuit 20 is deactivated during the normal operation mode and activated during the crack test mode. As shown in FIG. 2, the first switching circuit 20 is formed between the first pad 14a and the line structure 16. A signal is applied to the first switching circuit 20 from a mode registration set (MRS). The first pad 14a and the line structure 16 are electrically connected if a crack test mode signal is applied to the first switching circuit 20. The first switching circuit 20 may include one or more transistors and/or diodes controlled by the crack test mode signal.

In addition, according to an example embodiment, a second switching circuit 22 is deactivated during the normal operation mode and activated during the crack test mode. As shown in FIG. 2, the second switching circuit 22 is formed between the second pad 14b and the line structure 16. A signal is applied to the second switching circuit 22 from a mode registration set (MRS). The second pad 14b and the line structure 16 are electrically connected if a crack test mode signal is applied to the second switching circuit 22. The second switching circuit 22 may include one or more transistors and/or diodes controlled by the crack test mode signal.

Further, a control circuit 24 may be additionally formed to control the first and the second switching circuits 20 and 22. For example, if the crack test mode signal is applied to the control circuit from the MRS, the applied signal is modulated into a signal activating the first and the second switching circuits via a converter.

The first and the second switching circuits 20 and 22 and the control circuit 24 may be switching circuits that electrically connect the first and the second pads 14a and 14b to the line structure 16 only if the specific signal is applied.

For example, the first and the second switching circuits 20 and 22 may include one or more transistors. Further, the control circuit 24 includes at least one converter to modulate the signal outputted from the MRS and is connected to the gate electrode of the one or more transistors. Accordingly, if the signal outputted from the MRS is the crack test mode signal, the control circuit 24 activates the gate of the one or more transistors included in the first and second switching circuits 20 and 22.

The MRS may generate a test command using an address signal outputted from an address bus (not shown). Accordingly, the normal operation mode or the crack test mode may be selected and/or controlled in response to a signal generated by the MRS according to an example embodiment.

The first and the second switching circuits 20 and 22 are deactivated during a normal mode, e.g., during a normal write/read operation. Therefore, the first and the second switching circuits 20 and 22 are open during a normal write/read operation and thus, not electrically connected to the line structure 16. As such, during the normal write/read operation, a driving signal to the semiconductor chip may be input via the first and the second pads 14a and 14b.

Hereinafter, a method of inspecting a crack in a semiconductor chip according to an example embodiment is explained in detail. The substrate is physically divided into a plurality of semiconductor chips by a sawing process.

A semiconductor chip is set in the crack test mode in response to a signal received from the mode registration set (MRS). As previously indicated, the MRS may generate the test command by using an address signal transferred from an address bus (not shown), and the test command may be used to select the normal operation mode or the crack test mode. For example, when A__7 generates a command of the crack test mode, the crack test mode or the normal operation mode is set in accordance with a logical value of A__7.

The first switching circuit 20 connected between the first pad 14a and one end portion of the line structure 16 arranged along the peripheral region of the semiconductor chip 10, and the second switching circuit 22 connected between the second pad 14b and another end portion of the line structure 16 are activated in response to the signal received to place the semiconductor chip 10 in the crack test mode.

For example, if a first signal of logic "1" is applied to enable the crack test mode, the signal activates the first and the second switching circuits 20 and 22 via each inverter of the control circuit 24 shown in FIG. 2.

Then, a test signal for the crack test is applied to the both end portions of the first and the second pads 14a and 14b. The test signal has different voltage levels from a driving voltage applied to the first and second pads 14a and 14b during a normal operation such as a read/write operation, for example. According to an example embodiment, the voltage of the test signal is lower than a driving voltage of the semiconductor chip 10.

If the test signal is applied to end portions of the first and the second pads 14a and 14b, a line structure 16 is charged with an electric current. Then, the electric current between the first and the second pads 14a and 14b is measured. Measuring electric current is well-known in the art and thus, the specifics of obtaining the measurement current is omitted herein for the sake of brevity.

Once the current is measured, the measured current is analyzed to determine if the measured current is within a desired and/or predetermined range. Alternatively, the measure current may be analyzed to determine if the measured current is above or below a threshold value. The measured current may provide an indication as to the severity of a crack on the tested semiconductor chip. Alternatively, the measured current may indicate that a closer inspection of the crack is needed. As such, the crack is inspected by comparing the measured current with a desired and/or predetermined range, or a threshold, according to an example embodiment of a method for inspecting a crack.

For example, if the silicon wafer is sawed normally and a crack of the line structure 16 on the peripheral region of the semiconductor chip 10 is not created from the sawing operation, the current flows within the desired and/or predetermined range. As another example, if the silicon wafer is sawed normally and a crack of the line structure 16 on the peripheral region of the semiconductor chip 10 is not created from the sawing operation, the current flowing through the line structure 16 is above a threshold value.

Conversely, if the silicon wafer is sawed and a crack of the line structure 16 is created on the peripheral region of the semiconductor chip from the sawing operation, a portion of the line structure 16 may be damaged or a break may occur, thereby increasing the resistance of the line structure 16 and the current flowing through the line structure will be below under the desired and/or predetermined range or a threshold value.

As mentioned above, according to an example embodiment, the switching circuit is driven and the current between the first pad and the second pad is measured to inspect a crack of the tested semiconductor chip. In addition, extra pads are not required according to an example embodiment because the pads used for inspecting the crack of the tested semiconductor device during a crack test mode are the same pads used to drive the semiconductor chip during a normal operation mode. As such, the example embodiments described above eliminate the need for an extra region including pads specifically provided for testing a line structure, which is required in some conventional semiconductor chips.

Figure 3:
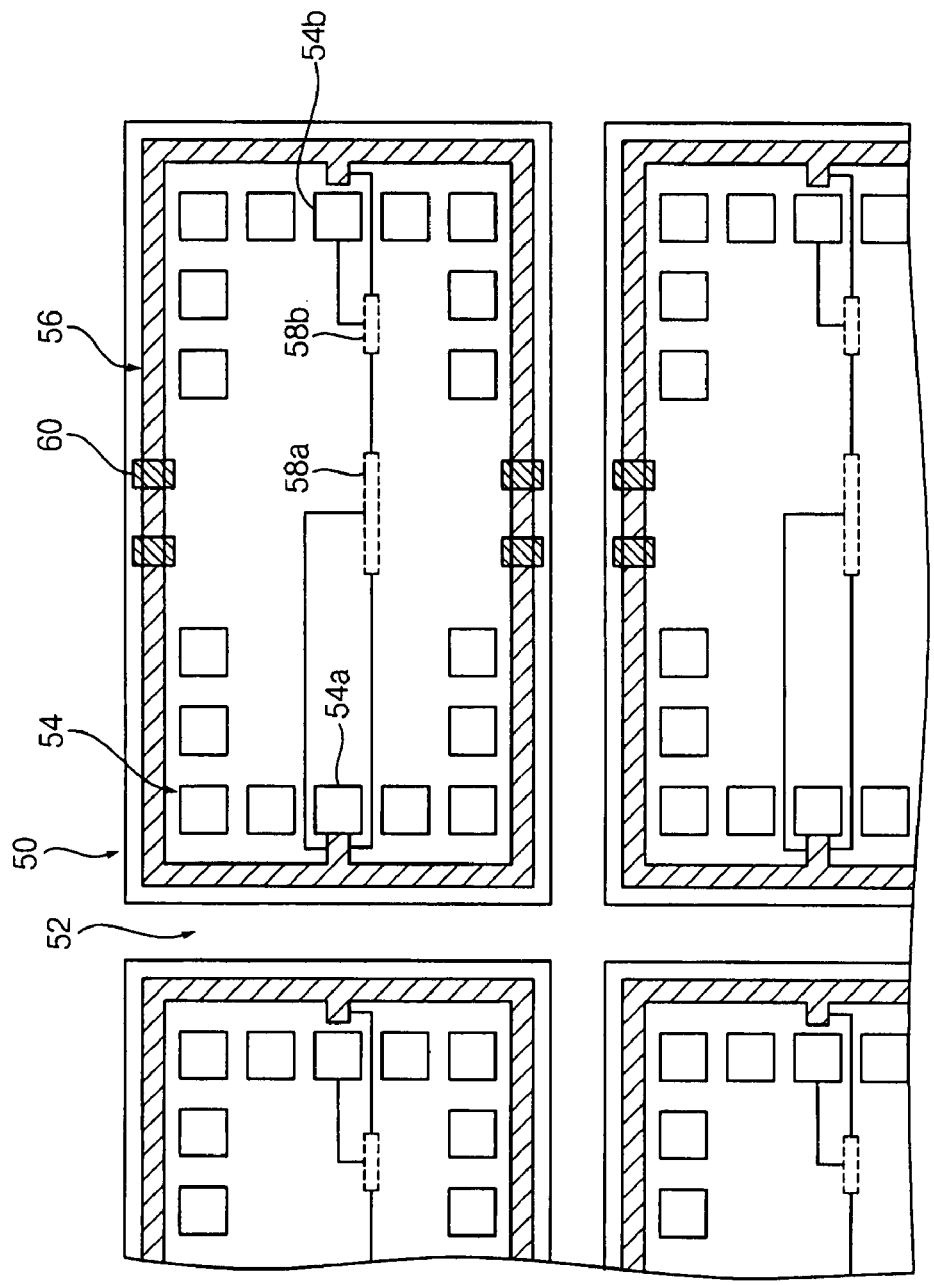
FIG. 3 is a plan view illustrating a semiconductor chip according to a second example embodiment.
Figure 4:
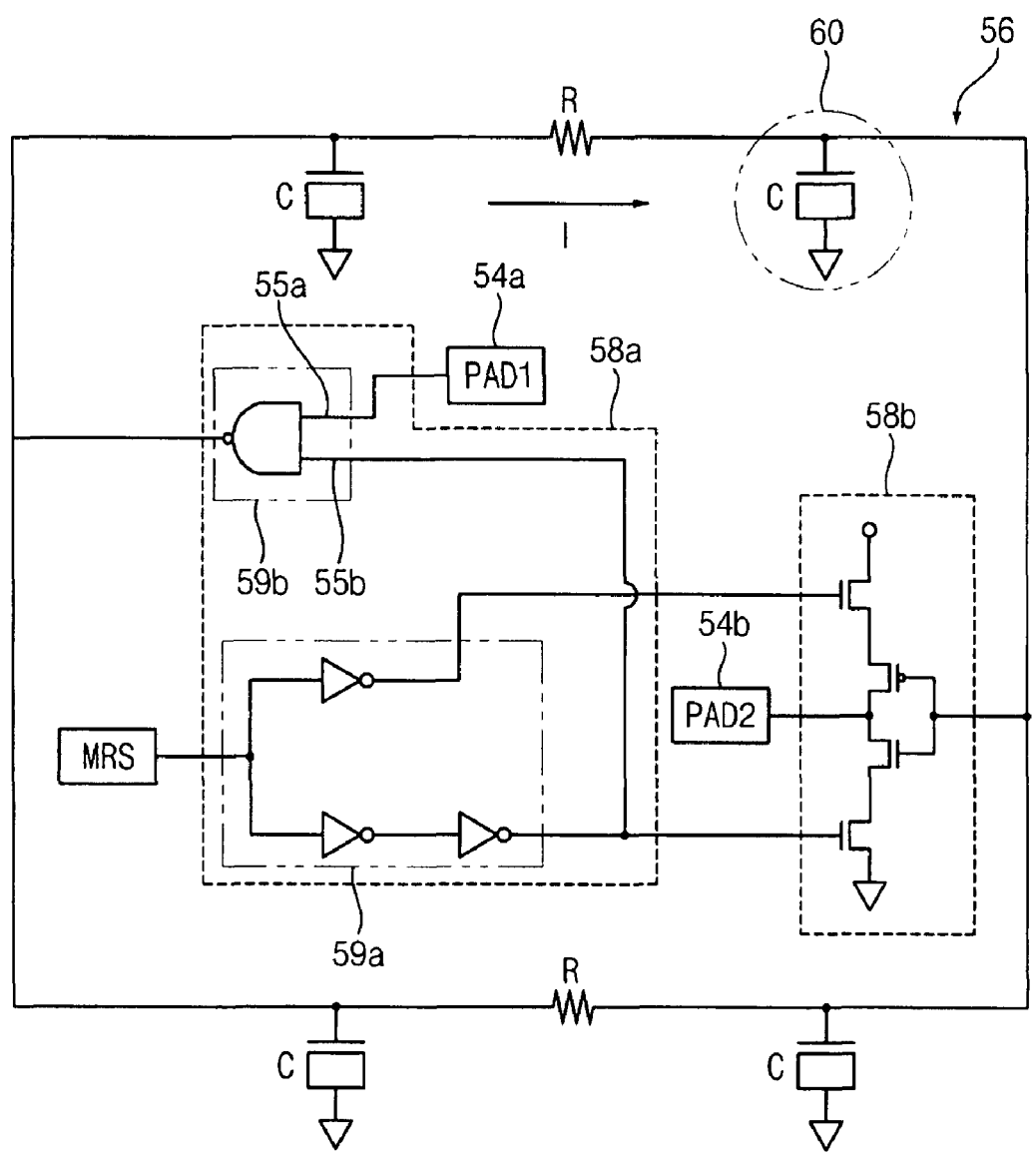
FIG. 4 is an example block diagram illustrating the semiconductor chip shown in FIG. 3.

FIG. 3 is a plan view illustrating a semiconductor chip according to another example embodiment. FIG. 4 is an example block diagram illustrating the semiconductor chip shown in FIG. 3.

Referring to FIGS. 3 and 4, a silicon wafer divided into a semiconductor chip region 50 and a scribe lane 52 is provided.

The semiconductor chip according to this example embodiment is formed on the semiconductor region 50 of the silicon wafer, and unit cells and peripheral circuits for driving the unit cells are formed on the semiconductor chip region 50.

In addition, pads 54 for applying an external electric signal to the circuits are formed on a peripheral region of the semiconductor chip region 50. Each of the pads 54 may be classified as an address pad for assigning addresses of the unit cells, a data pad for inputting and outputting data to and from the unit cells, or a command pad for setting the unit cells into a functional state, for example.

Still referring to FIG. 3, a line structure 56 is formed in the peripheral region of the semiconductor chip region 50. The line structure 56 may have a linear shape surrounding most of the peripheral region of the semiconductor chip region 50. In addition, the line structure 56 may have a linear shape surrounding the entire peripheral region of the semiconductor chip region 50.

Two of the pads 54 may be for applying the electrical signal to the semiconductor chip and may be arranged on different end portions of the line structure 56 according to an example embodiment. For example, a first pad 54a is arranged on one end portion of the line structure 56 and a second pad 54b is arranged on another end portion of the line structure 56. According to an example embodiment, the first and the second pads 54a and 54b are used for applying the electrical signal to drive the cells during a normal operation mode and inspecting a crack of the semiconductor chip during a crack test mode.

As shown in FIG. 3, one or more capacitors 60 are formed, which are connected between the line structure 56 and ground to delay the signal propagating through the line structure 56. The one or more capacitors 60 may be metal-oxide-silicon (MOS) capacitors, planar-type capacitors, etc.

Still referring to FIG. 3, a combining circuit 58a is formed, which is connected between the first pad 54a and the line structure 56. The combining circuit 58a blocks a signal outputted from the first pad 54a during the normal operation mode, and passes the signal outputted from the first pad 54a through the line structure 56 during the crack test mode. The combining circuit 58a may operate based on and/or be controlled in response to a combination of the test signal outputted from the first pad 54a and a mode set signal An example block diagram of the combining circuit 58a is illustrated in FIG. 4. The combining circuit 58a includes a first signal modulator 59a and a second signal modulator 59b. The first signal modulator 59a receives and modulates the mode set signal. The second signal modulator 59b includes a first input portion 55a and a second input portion 55b. The first input portion 55a receives the signal inputted to the first pad 54a, and the second input portion 55b receives a signal outputted from the first signal modulator 59a. The second signal modulator 59b provides a signal having a voltage level depending on the signals inputted through the first and the second input portions 55a and 55b. The first signal modulator 59a may include a converter in series, for example. The second signal modulator 59b may include a NAND logic circuit or an AND logic circuit, for example.

An example block diagram of a driving circuit 58b is also shown in FIG. 4. The driving circuit 58b is formed and connected between the second pad 54b and the line structure 56. According to an example embodiment, the driving circuit 58b is deactivated during the normal operation mode and activated during the crack test mode. The driving circuit 58b is controlled based on the mode set signal. During the crack test mode when the driving circuit 58b is activated, the driving circuit 58b applies a test signal propagating through the line structure 56 to the second pad 54b. The test signal outputted from the driving circuit 58b and applied to the second pad 54b has a logic value that is different from a logic value of the signal applied to the first pad 54a according to an example embodiment.

Therefore, a signal delay may be measured that represents the amount of time for the test signal outputted from the first pad 54a to reach the second pad 54b. That is, the time when the signal outputted from the first pad 54a reaches the second pad 54b may be measured by measuring the time of a measurement when signal logic is modulated.

According to the above-described example embodiment, the crack of the semiconductor chip may be inspected using the pads used for driving the semiconductor chip during a normal operation instead of extra pads specifically provided for testing the semiconductor chip for a crack. In addition, even a minute crack hardly causing any current changes may be inspected by measuring the time duration required for the test signal outputted from the first pad to reach the second pad.

Hereinafter, another example embodiment for a method of inspecting a crack in a semiconductor chip is explained in detail. The substrate is physically divided into a plurality semiconductor chips by a sawing process.

A semiconductor chip is set in the crack test mode in response to a signal received from the MRS. A test signal is then applied to the first pad 54a. According to an example embodiment, the test signal has a different voltage level than a voltage level of a driving voltage applied during a normal operation mode. For example, the test signal may have a voltage level lower than the voltage level of the driving voltage applied during the normal operation mode. The test signal is applied to the first pad 54a is provided to the line structure 56 in response to the combination of the crack test mode signal and the test signal. Accordingly, when the crack test mode signal and the test signal are applied, the line structure 56 is charged with an electric current.

The test signal passed through the line structure 56 is delayed by the one or more capacitors 60 connected between the line structure 56 and the ground. Then, the current passed through the line structure 56 flows into the second pad 54b.

A signal having a different logic value from the test signal inputted to the first pad 54a is outputted through the driving circuit 58b arranged between the second pad 54b and the line structure 56. The signal passed through the driving circuit 58b is provided to the second pad 54b.

A time delay between a time when the signal reaches the second pad 54b and a time of applying the test signal to the first pad 54a is measured according to an example embodiment. Measuring a time delay is well-known in the art and thus, the specifics of this measurement will be omitted herein for the sake of brevity.

Once the time delay is measured, the time delay is analyzed to determine if the measured time delay is within a desired and/or predetermined range. The measured time delay provides an indication as to the severity of a crack on the tested semiconductor chip. As such, the crack is inspected by comparing the measured time delay with a desired and/or predetermined range according to the example embodiment illustrated in FIGS. 3 and 4.

For example, if a crack of the line structure 56 formed on the peripheral region of the semiconductor chip is generated during a sawing process, a portion of the line structure 56 may be damaged or a break may occur, thereby increasing the resistance of the line structure 56. As such, if a crack is formed, the respondent signal is not generated or a time duration before the respondent signal is provided is increased.

Conversely, if the silicon wafer is sawed normally and a crack of the line structure 56 on the peripheral region of the semiconductor chip is not created, a respondent signal is generated within an allowable range of a time delay.

According to the example embodiment described referring to FIGS. 3 and 4, a crack of a semiconductor chip may be electrically inspected without the need for providing extra pads only used for testing the crack. In addition, a minute crack hardly causing any current changes may be inspected by measuring a time delay. Accordingly, a semiconductor chip, which still allows for testing a crack in the semiconductor chip, may have increased integration and reliability.

The foregoing description of example embodiments is not to be construed as limiting. Although a few example embodiments have been described, those skilled in the art will readily appreciate that many modifications are possible in the example embodiments without materially departing from the novel teachings and advantages of this disclosure. Accordingly, all such modifications are intended to be included within the scope of this disclosure as defined by the following claims, with equivalents of the claims to be included therein.

What is claimed is:

1. A semiconductor chip comprising:
a plurality of pads on a peripheral region of the semiconductor chip and configured to apply an external electric signal to circuits in the semiconductor chip;
a line structure along the peripheral region of the semiconductor chip between the plurality of pads and the peripheral region of the semiconductor chip, the line structure configured to inspect a crack and having a continuous structure, wherein
the line structure forms a rectangular shape enclosing in its entirety the plurality of pads;
a first pad of the plurality of pads on one end portion of the line structure;
a second pad of the plurality of pads on another end portion of the line structure; and an inspection device activated during a crack test mode to electrically connect the first pad, the line structure and the second pad, wherein the first and second pads are configured to receive a test signal in the crack test mode and a signal driving the semiconductor chip in a normal mode, and the inspection device is configured to detect the test signal propagating through the line structure from the first pad to the second pad in the crack test mode.

2. The semiconductor chip of claim 1, wherein the inspection device is deactivated during a normal operation mode.

3. The semiconductor chip of claim 1, wherein the inspection device comprises:

a first switching circuit connected between the first pad and the line structure, the first switching circuit being deactivated during a normal operation mode and activated during the crack test mode; and a second switching circuit connected between the second pad and the line structure, the second switching circuit being deactivated during a normal operation mode and activated during the crack test mode.

4. The semiconductor chip of claim 1, wherein the inspection device is activated and deactivated based on a mode set signal.

5. The semiconductor chip claim 3, wherein the first and the second switching circuits include at least one of a transistor and a diode, the at least one of the transistor and the diode being controlled by the crack test mode signal.

6. The semiconductor chip of claim 1, further comprising:

at least one capacitor connected between the line structure and ground to delay a test signal propagating through the line structure, wherein the inspection device comprises:

a combining circuit connected between the first pad and the line structure, the combining circuit blocking a signal applied to the first pad during a normal operation mode and passing a test signal applied to the first pad during a crack test mode to the line structure based on the test signal and a mode set signal; and a driving circuit connected between the second pad and the line structure, the driving circuit applying a response signal corresponding to the delayed test signal to the second pad during the crack test mode.

7. The semiconductor chip of claim 6, wherein the combining circuit comprises:

a first signal modulator receiving and modulating the mode set signal; and a second signal modulator having a first input portion receiving the signal inputted to the first pad and a second input portion receiving a signal outputted from the first signal modulator, the second signal modulator outputting the test signal having a signal level controlled based on the signal inputted to the first pad and the signal outputted from the first signal modulator.

8. The semiconductor chip of claim 7, wherein the second signal modulator includes one of a NAND logic circuit and an AND logic circuit.

9. The semiconductor chip of claim 6, wherein the driving circuit includes an inverter outputting a logic signal different from the signal applied to the first pad.

10. The semiconductor chip of claim 6, wherein the first and the second pads receive a test signal during the crack test mode and a signal for driving the semiconductor chip during a normal operation mode.

11. A method of inspecting a crack of a semiconductor chip, comprising:

providing the semiconductor chip including a plurality of pads on a peripheral region thereof, and a line structure enclosing in its entirety the plurality of pads and having a continuous rectangular structure along the peripheral region of the semiconductor chip between the plurality of pads and the peripheral region of the semiconductor chip and being configured to inspect the crack, the plurality of pads applying an external electric signal to circuits in the semiconductor chip and including a first pad on one end portion of the line structure and a second pad on another end portion of the line structure, and the line structure;

setting the semiconductor chip into a crack test mode in response to a test mode signal;

activating an inspection device of the semiconductor chip and electrically connecting the first pad, the line structure, and the second pad;

applying the test signal to at least one of the first and second pads that propagates through the line structure to the other of the first and second pads, the propagating test signal being detected by the inspection device;

measuring a characteristic relating to the applied test signal and providing an indication of the presence or severity of the crack; and outputting the measured characteristic.

12. The method of claim 11, wherein activating the inspection device includes activating a first switching circuit connected between one end portion of the line structure and the first pad, and a second switching circuit connected between another end portion of the line structure and the second pad in response to the test mode signal.

13. The method of claim 11, wherein measuring a characteristics includes measuring a current flowing between the first and second pads during the crack test mode.

14. The method of claim 13, further comprising:

comparing the current flowing between the first and second pads to a threshold value; and determining a severity of the crack if the measured current is lower than the threshold value.

15. The method of claim 11, wherein a voltage level of the test signal is lower than a voltage level of a driving signal of the semiconductor chip applied during a normal operation mode.

16. The method of claim 11, wherein the test signal propagating through the line structure is delayed by at least one capacitor connected between the line structure and ground, the at least one signal is a test signal input via the first pad and a test mode signal, and the measured characteristic is a time delay between when the test signal is applied to the first pad and a time when the delayed test signal reaches the second pad.

17. The method of claim 16, further comprising:

comparing the time delay with an allowable range; and determining a severity of the crack if the time delay is outside the allowable range.

* * * * *